United States Patent [19]

Iwasaki et al.

[11] Patent Number: 5,742,216
[45] Date of Patent: Apr. 21, 1998

[54] CONTACT MAKING AND BREAKING DEVICE AND SYSTEM FOR MEASURING LOW CURRENT

[75] Inventors: Yuko Iwasaki; Susumu Takagi; Hideyuki Norimatsu, all of Tokyo, Japan

[73] Assignee: Hewlett-Packard Company, Palo Alto, Calif.

[21] Appl. No.: 626,790

[22] Filed: Apr. 2, 1996

[30] Foreign Application Priority Data

Apr. 5, 1995 [JP] Japan ................................. 7-104720

[51] Int. Cl.$^6$ ...................................................... H01H 1/66
[52] U.S. Cl. .............................. 335/151; 361/88; 307/116
[58] Field of Search ........................ 335/151–4; 361/88, 361/91, 102, 111, 117; 307/116, 130

[56] References Cited

U.S. PATENT DOCUMENTS

| | | |
|---|---|---|
| 4,638,276 | 1/1987 | Hauk .................................. 335/151 |
| 4,661,791 | 4/1987 | Wakasugi et al. . |
| 4,922,369 | 5/1990 | Sakatos ............................... 335/151 |
| 5,252,936 | 10/1993 | Norimatsu . |

*Primary Examiner*—Lincoln Donovan

[57] ABSTRACT

A contact making and breaking device improves the dielectric absorption property of capacitance between one signal wire brought out from a reed switch and an conductive casing. A low current measurement system using the contact making breaking device greatly shortens the measurement waiting time when low current is measured. The contact making and breaking device includes a reed switch with first and second signal wires brought out from either end, a conductive casing, and an insulating material formed between at least the first signal wire and the conductive casing. A tubular conductor is emplaced in the region in which the insulating material is formed and at least partially encloses the reed switch. The tubular conductor is connected to the first signal wire.

8 Claims, 6 Drawing Sheets

PRIOR ART

CONTACT MAKING AND BREAKING DEVICE AND SYSTEM FOR MEASURING LOW CURRENT

FIELD OF THE INVENTION

This invention concerns a contact making and breaking device using a reed switch in combination with a system for measuring low current. More specifically, it concerns a contact making and breaking device which greatly improves the dielectric absorption properties of capacitance between one signal wire brought out from the reed switch and an external conductor. It further concerns a system which contains a current source that uses the contact making and breaking device in a manner which greatly shortens (or reduces to zero) the measurement waiting time (the time until the erroneous current becomes small enough not to affect the measurement) when low current is measured.

BACKGROUND OF THE ART

Figure 6:
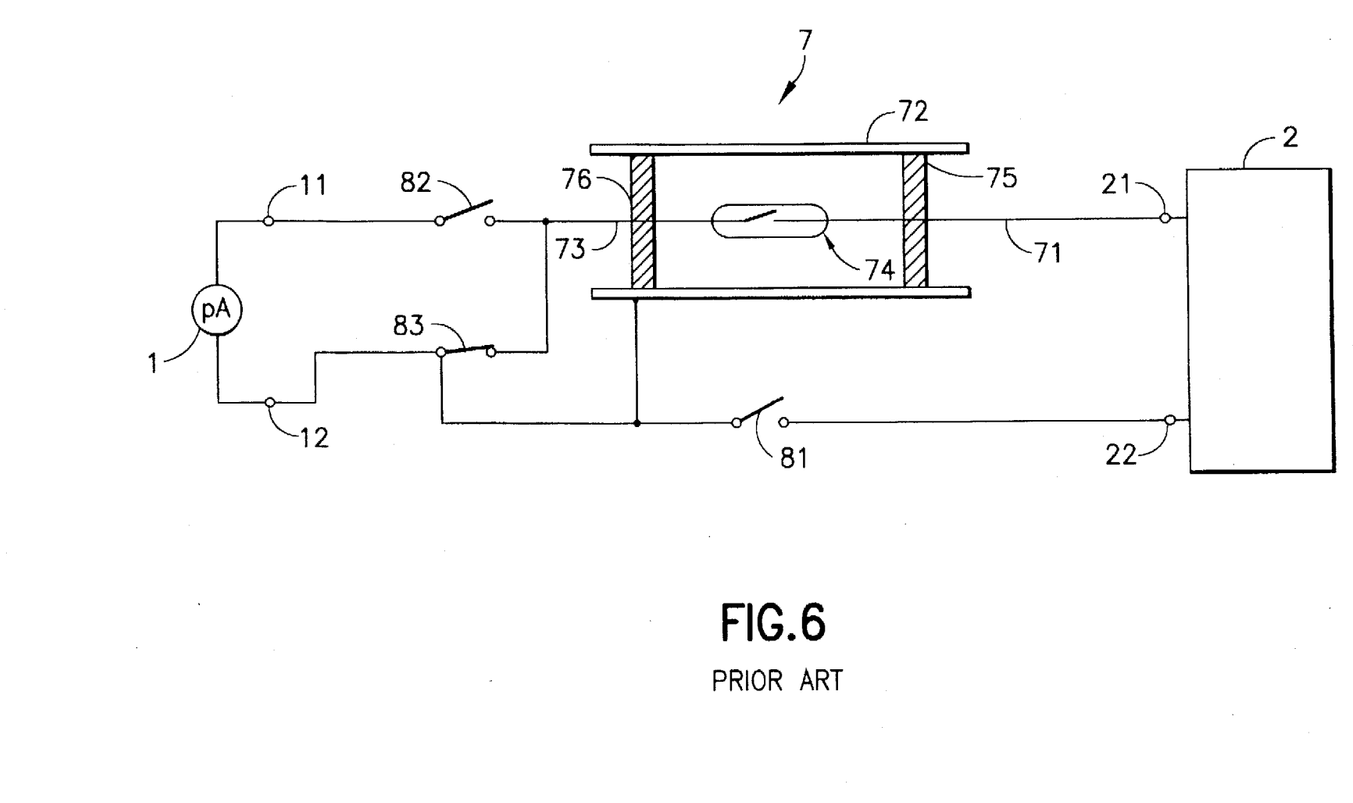
FIG. 6 is a diagram showing low current measurement system using a conventional reed relay.

FIG. 6 shows an example of a prior art system for measuring low current. In FIG. 6, a core wire of a reed relay 7 (signal line 71 brought out from reed switch 74) is connected to a signal output terminal (force terminal 21) of a system which contains a current source and which has an active guard. External conductive casing 72 of reed relay 7 is connected to a guard terminal 22 of a system containing a current source 2, through a switch 81, and to a ground terminal (guard terminal 12) of a picoammeter 1 (pA in FIG. 6). The other core wire of reed relay 7 (i.e., signal line 73) is connected to the signal input terminal (sense terminal 11) of picoammeter 1 and to the ground terminal (guard terminal 12) through switches 82 and 83. The drive coil of reed relay 7 is omitted in FIG. 6.

In this measurement system, when current flowing through force terminal 21 from current source 2 is not being measured (i.e., during non-measurement period), the contact points of reed switch 74 and switches 81 and 82 are opened, and switch 83 is closed. When the current flowing through force terminal 21 from current source 2 is being measured (i.e., during measurement period), an opposite configuration is present: i.e., reed switch 74 and switches 81 and 82 are closed, and switch 83 is opened.

As mentioned above, signal wire 73 and conductive casing 72 are forced to the same potential in both the current non-measurement and the current measurement periods through the operation of reed switch 74 and switches 81–83.

Figure 7:
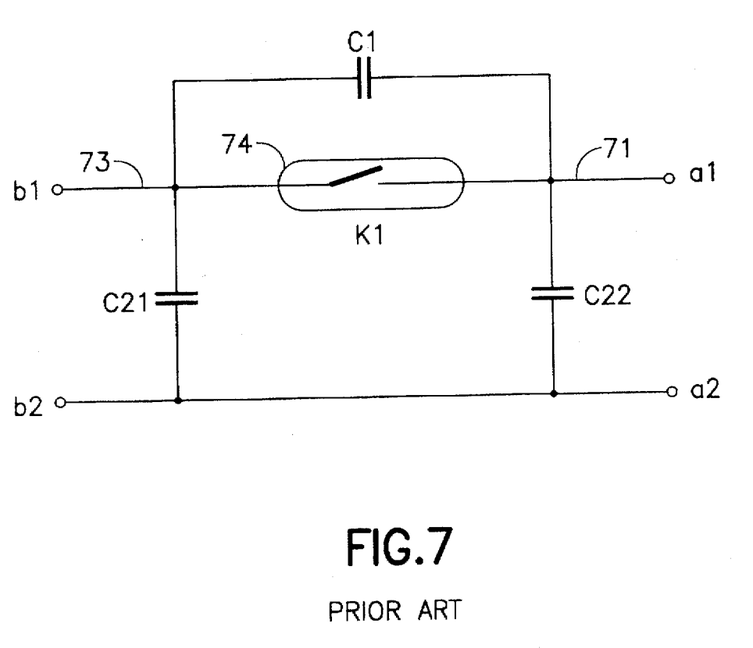
FIG. 7 is a diagram showing an equivalent circuit of the reed relay in FIG. 6.

In the measurement system of FIG. 6, however, there are cases in which the voltage which appears at force terminal 21 differs during the current non-measurement and current measurement periods. The operation in this case will be explained by referring to the equivalent circuit of the reed relay in FIG. 7. In FIG. 7, a1 and a2 are terminals which are connected, respectively, to force terminal 21 and guard terminal 22. Terminals b1 and b2 are connected respectively to sense terminal 11 and guard terminal 12 of picoammeter 1. K1 is the contact point of the reed switch, C1 the capacitance between signal lines 71 and 73, C22 is the capacitance between signal wire 71 and external casing 72, and C21 is the capacitance between signal wire 73 and external casing 72.

When a voltage appears at force terminal 21, that voltage charges signal line 71 and external casing 72 with a charge that is based on static capacitance C22.

When current is being measured, reed switch 74 and switches 81 and 82 are closed, while switch 83 is opened, as mentioned above. If at this time, there is only air in the capacitance space between signal wire 71 and conductive casing 72, the charging current flows instantly into picoammeter 1. However, in reed relay 7 shown in FIG. 6, reed switch 74 is within conductive casing 72, so that insulating parts 75 and 76 are interposed in the capacitance space. This produces the following problems.

Insulating parts 75 and 76 have dielectric absorption properties. The dielectric absorption due to insulating part 75 prevents an instantaneous discharge of the charge between signal wire 71 and conductive casing 72 (capacitance C22 in Pig. 7). Therefore, when the output current of force terminal 21 is measured by picoammeter 1, the current measurement cannot be performed until a suitable time passes after reed switch 74 is closed (i.e., there is a large measurement waiting time).

For example, in the case of a conventional reed relay 7, if it is assumed that a voltage of 100 v appears on the signal wire 71 (immediately before the current measurement), the value of the current due to the discharge of the charge between signal wire 71 and external conductor 72 frequently requires several tens of seconds to fall to the femto-ampere level.

This invention has the objective of providing a contact making and breaking device which (i) greatly improves the dielectric absorption properties of capacitance between a signal wire emanating from a reed switch and an external conductive casing, and (ii) greatly shortens (or reduces to zero) the measurement waiting time (the time until the erroneous current becomes small enough not to affect the measurement) when low current is measured.

The aforementioned problems are caused by:

(1) the fact that an insulating part is present which reduces the dielectric absorption property in the capacitance space (see C22 in FIG. 7) between the signal wire and the conductive casing of the reed relay that is connected to the system which contains a current source; and (2) the fact that, during the non-measurement period, the current due to the charge between the signal wire (connected to the system which contains a current source) and the external conductor (i.e., the charge based on the existence of the aforementioned insulating part) flows into the picoammeter as an error current when one tries to start a current measurement (when the reed relay is closed).

SUMMARY OF THE INVENTION

The inventors, noting (1) and (2) above, have discovered that:

(1) the aforementioned problems can be solved by covering the space between the signal wire and the external conductor with a tubular conductor, so that no insulating part exists in the capacitance space between the signal wire and the external conductor; and (2) since the aforementioned tubular conductor is placed in the external conductive casing, some of insulating parts are present in the capacitance space between the signal wire from the reed switch (the signal wire on the side connected to the system which contains a current source) and the tubular conductor. A closed circuit is thus formed, so that current due to the charge resulting from the insulating part does not flow into the picoammeter.

This invention comprises a contact making and breaking device which has a reed switch with two signal wires brought out from either end and an external conductive casing, as well as an insulating part formed between at least one of the aforementioned signal wires and the external conductive casing. A tubular conductor is placed in the region formed by the insulating part between at least one of the signal wires and the external conductive casing. The tubular conductor is electrically connected to the other of the two signal wires.

In the contact making and breaking device of this invention, because of the presence of the tubular conductor, there is no insulating part, or an extremely small one, in the capacitance space formed between the signal wire and the conductive casing. Therefore, capacitance between the signal wire and the external conductor either produces no dielectric absorption at all, or one which is negligibly small.

The contact making and breaking device of this invention also contains, besides a dry reed relay, called a "reed relay," a wetted reed relay, called a "mercury relay". As to the insulating material, it is desirable to use a material with an excellent dielectric absorption property, such as polytetrafluoroethylene.

In this invention, insulating parts are present between the ends of the conductive casing and the two signal wires brought out from the ends of the reed switch. For example, an insulating part can be used which has a central hole that abuts the tubular conductor (i.e., a "circular insulating part"). The insulating part, the inner-diameter-end surface of which abuts the tubular conductor and the outer-diameter-end surface of which abuts the external conductive casing (i.e., the "ring-shaped insulating part"), and the reed switch and the tubular conductor can be placed inside the external conductive casing. The ends of the tubular conductor can also be made so that they terminate at the outer-end surfaces of the insulating part.

It is preferable, for the ends of the tubular conductor to project outside the insulating part, between one end of the tubular conductor (on the side of one of the signal wires) and the conductive casing, so that no insulating material is placed in the capacitance space between one of the signal wires and the conductive casing.

A tubular conductor can also be used which covers the whole of the reed switch, and an insulating part or conductive part is formed at the end where the other signal wire is brought out. In this case, the other signal wire is supported by the insulating part or conductive part.

If the other signal wire is supported by the insulating material, the signal wires and the tubular conductor are electrically connected by wires. When the other signal wire is supported by the conductive part, a hole is made in the conductive part, through which the signal wire is passed, and this signal wire is electrically connected to the tubular conductor, with the aforementioned conducting part between them.

In the contact making and breaking device of this invention, the specific method by which the aforementioned signal wires are supported by the insulating parts and the specific shape of the tubular conductor are not limited to those described above; this invention includes other embodiments, which are not shown in the examples described below (FIGS. 4A–C). Further, the positional relationships between the ends of the external conductor and the ends of the tubular conductor may be as desired. Considering the operation of the guard with respect to the signal wires, due to the external conductive casing, etc., it is preferable for the ends of the external conductor to project outward beyond the ends of the tubular conductor.

In the system for measuring low current of this invention, the signal input terminal of the ammeter is connected to the signal output terminal of the system that contains a current source, through the contact making and breaking device which uses a reed switch. The measurement system of this invention assumes that the voltage which appears at the signal output terminal can be different when the current is being measured and when it is not being measured.

In the measurement system of this invention, the contact making and breaking device is wired in such a way that one of the signal wires is connected to the signal output terminal of the system that contains a current source and the other signal wire is connected to the signal input terminal of the ammeter. Moreover, when the current is not being measured, the connection is opened between the signal wire that is connected to the system's signal output and the conductive casing. When the current is being measured, the signal wire connected to the signal output terminal and the conductive casing is short-circuited through the ammeter.

The current due to the charge between the signal wire from the reed switch and the external conductor, while the current was not being measured (corresponding to the charge C22 in FIG. 7), flows into the picoammeter when the contact of the reed switch is closed. However, since there is no insulating part in the capacitance space formed between the signal wire and the external conductor, or at most a very small insulating part, the charge current instantly reaches zero.

The current due to the charge between the signal wire and the tubular conductor, when the current is not being measured (corresponding to the charge C1 in FIG. 7), flows through the closed circuit formed when the contact of the reed switch is closed. Since there is an insulating part in the capacitance space between the signal wire and the tubular conductor, the current which flows through this closed circuit does not instantly become zero. However, since this current does not flow into the picoammeter, it has no effect on the current measurement.

in the system described above, there may also be an insulating part between the signal wire on the side on which the tubular conductor of the reed switch is connected (the other reed wire) to the conductive casing, or in the capacitance space between the tubular conductor and the external conductor (these correspond to C21 of FIG. 7). In the system, however, since the signal wire on the side to which the tubular conductor is connected is always at the same potential as the conductive casing, no charge based on this capacitance is produced between the signal wire on the side to which the tubular conductor is connected and the conductive casing.

In the system for measuring low current of this invention, when the reed switch is closed, the charge current flowing into the picoammeter instantly becomes zero; therefore, a long waiting time is not needed for the low current measurement.

DETAILED DESCRIPTION OF THE INVENTION

Figure 1A:
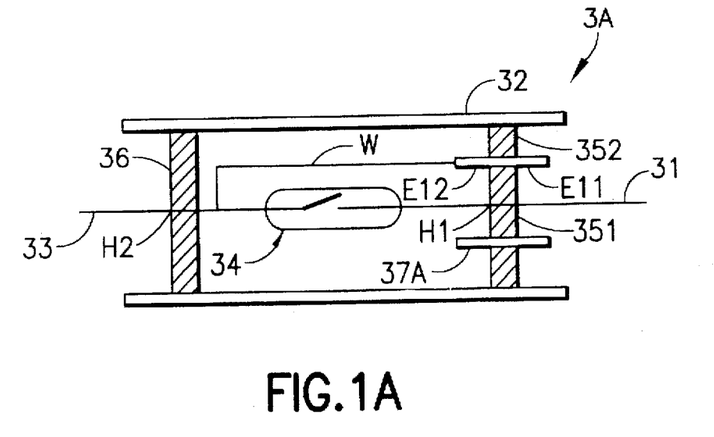
FIG. 1A shows an example of the contact making and breaking device of this invention which uses a tubular conductor.
Figure 1B:
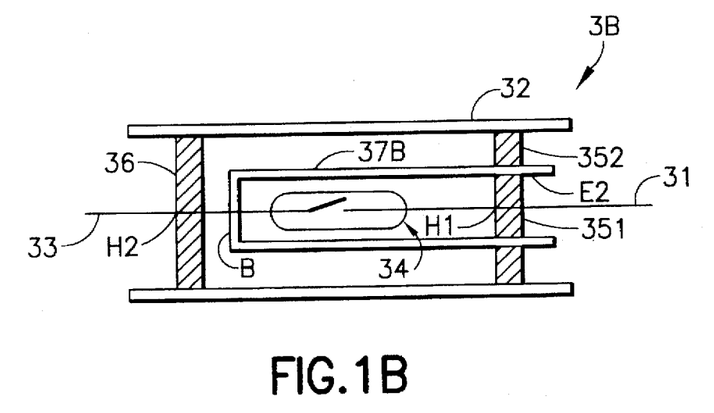
FIG. 1B shows an example of the contact making and breaking device of this invention which uses a tubular conductor with one closed end.
Figure 1C:
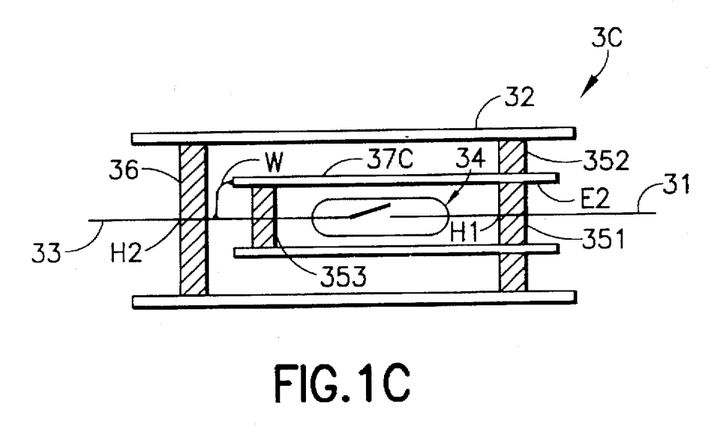
FIG. 1C shows an example of the contact making and breaking device of this invention which uses a tubular conductor the same length as in FIG. 1(B), but with both ends open.

FIGS. 1A–1C show an example of the contact making and breaking device of this invention (i.e. a dry reed relay). In reed relay 3A (FIG. 1A), a circular insulating part 351 with a central hole H1 is positioned inside of one end of a tubular conductive casing 32. A tubular conductor 37A is placed so that it encloses circular insulating part 351. A ring-shaped insulating part 352 is positioned between the outside of tubular conductor 37A and the inside of the conductive casing 32. A circular insulating part 36 with a central hole H2 is positioned within the other end of the conductive casing 32.

A reed switch 34 is placed between circular insulating parts 351 and 36 to enable a signal wire 31, brought out from the reed switch 34, and another signal wire 33, to pass through central holes Hi and H2. Tubular conductor 37A is connected to signal wire 33 by wire W. The ends E11 and E12 of tubular conductor 37A project to both sides of ring-shaped insulating part 352. In this way, the device is made so that there are no insulating parts 352 or 351 in the capacitance space between signal wire 31 and conductive casing 32 (or if there is, it is extremely small). Therefore, there is almost no dielectric absorption between signal wire 31 and conductive casing 32.

The dielectric absorption of the contact making and breaking part (i.e., the reed relay) will be explained below, with reference to FIG. 2. Furthermore, in the reed relay of FIG. 2 and the reed relay of FIG. 1A, the shapes of tubular conductors 37 differ slightly. Although this is not shown in the FIG. 2, in tubular conductor 37 of FIG. 2, the part outside of insulating part 351 is formed so that it projects, in the same manner as in FIG. 1A (the projecting part is shown by the symbol E), and the part inside insulating part 351 extends toward the center of the reed relay.

Figure 2:
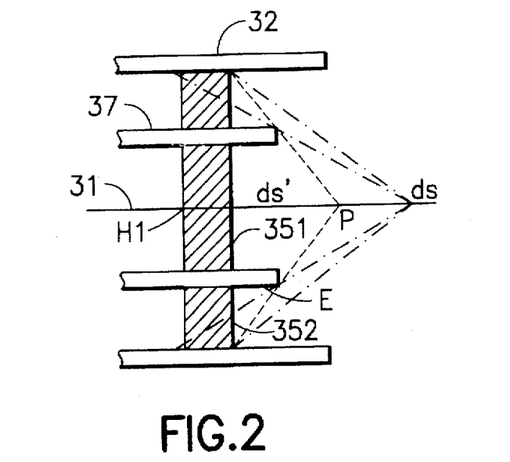
FIG. 2 is a diagram explaining the dielectric absorption of a contact making and breaking part (reed relay) of this invention.

In FIG. 2, when the outside piece of signal wire 31 is to the left of point P (i.e., the piece of the wire indicated by ds'), the end E of tubular conductor 37 hides ring-shaped insulating part 352 from ds'. That is, no capacitance is present between ds' and conductive casing 32, or it is formed only by air. Therefore, the component of the capacitance due to ring-shaped insulating part 352, between the part of the signal wire 31 to the left of point P and conductive casing 32, is zero, and no dielectric absorption is produced.

Moreover, when the outside piece of signal wire 31 extends to the right of point P (i.e., the piece designated ds), ring-shaped insulating part 352 can be seen from ds (the region in which it can be seen is shown by the dot-and-dash line). That is, a capacitance is formed between ds and conductive casing 32 through the air and the dielectric (part of insulating part 352). Therefore, the dielectric absorption of this dielectric remains a problem.

The component of the capacitance between ds and conductive casing 32 that is due to insulating part 352 becomes small if ds is a certain distance away from point P. Therefore, by choosing the length of the projecting part of the tubular conductor 37 so that the capacitance component due to insulating part 352 is made sufficiently small, the dielectric absorption of the capacitance between signal wire 31 and the conductive casing 32 can be reduced.

When, for example, the end E of the tubular conductor 37 does not project outside the ring-shaped insulating part 352, ring-shaped insulating part 352 is visible from the piece of the signal wire 31 outside insulating part 352 (e.g., from the piece ds'). Nevertheless, the dielectric absorption produced between signal wire 31 and the conductive casing 32 is very small, compared to the dielectric absorption of conventional reed relay 7 shown in FIG. 6. Therefore, if the demands placed on the dielectric absorption properties are not too stringent, one can make end E so that it does not project from the end surface of ring-shaped insulating material 352.

In reed relay 3B of FIG. 1B, a tubular conductor which covers all of reed switch 34 is used. This tubular conductor 37B has one closed end B that supports signal wire 33. Reed relay 3B of FIG. 1B has the same make-up as reed relay 3A of FIG. 1A, except that it uses tubular conductor 37B instead of tubular conductor 37A and wire W. In FIG. 1B, end E2 of the tubular conductor 37B projects from the end of ring-shaped insulating part 352, as in FIG. 1A. Moreover, closed end B is connected electrically to signal wire 33 inside insulating part 36 which supports the wire 33.

In reed relay 3C of FIG. 1C, a tubular conductor 37C is used, which has about the same length as tubular conductor 37B and is open at both ends. A circular insulating part 353 which has a central hole H3, is placed inside tubular conductor 37C on the end which is on the side of signal wire 33, and signal wire 33 passes through this central hole H3. Tubular conductor 37C is connected to signal wire 33 by a wire W.

In FIG. 1C, the left end part of tubular conductor 37C can also be made so that it penetrates through insulating part 36. In this case, the shape of the end of the reed relay on the side of insulating part 36 can be made with the same structure as the ends on the sides of insulating parts 351 or 352 in FIGS. 1A–C, or it can be made with the same structure as the ends of the sides of the insulating parts 351 and 352 in the reed relay of FIG. 4B, as described below. In either case, tubular conductor 37C is connected to signal wire 33 with a wire W outside insulating part 36.

Figure 3A:
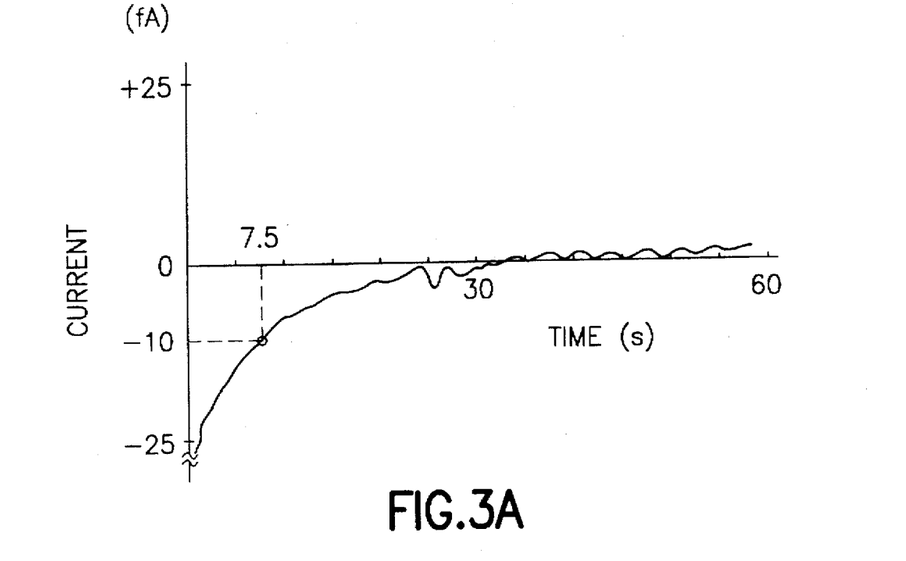
FIG. 3A is a graph showing the relationship between time and the discharge current due to the charge between the signal wire and the conductive casing in a conventional reed relay.
Figure 3B:
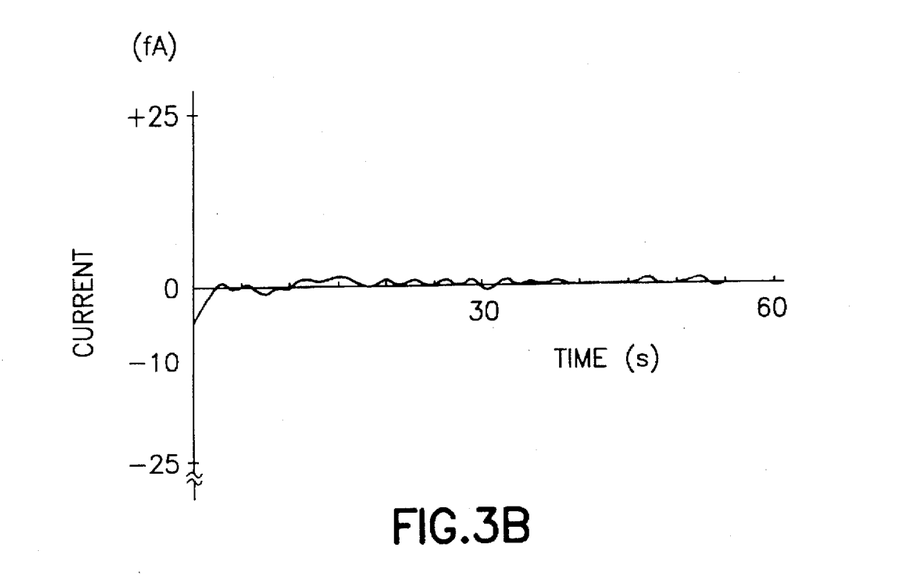
FIG. 3B is a graph showing the relationship between time and the discharge current due to the charge between the signal wire and the conductive casing in a reed relay of this invention.

FIGS. 3A and 3B are graphs showing a comparison of the properties of conventional reed relay 7, shown in FIG. 6, and reed relay 3, shown in FIG. 1B. FIGS. 3A and 3B show the relationship between the charge current flowing between the terminals and elapsed time between the time when the contact points of the respective reed relays are first open; a voltage of 100 V is applied for 60 seconds between one signal wire and the conductive casing; and then the reed relay contact point is closed.

As can be seen from FIGS. 3A and 3B, in conventional reed relay 7, approximately 7.5 seconds are required for the discharge current to become 10 fA, while in reed relay 3, shown in FIG. 1B, the discharge current becomes zero almost instantly. This affect is also shown by the reed relays of FIGS. 1A and 1C and FIGS. 4A–C, described below.

The contact making and breaking device of this invention is not limited to the examples described above; one can employ various methods of supporting the signal wires of the reed switch by insulating parts, and the tubular conductor employed may have various shapes.

Figure 4A:
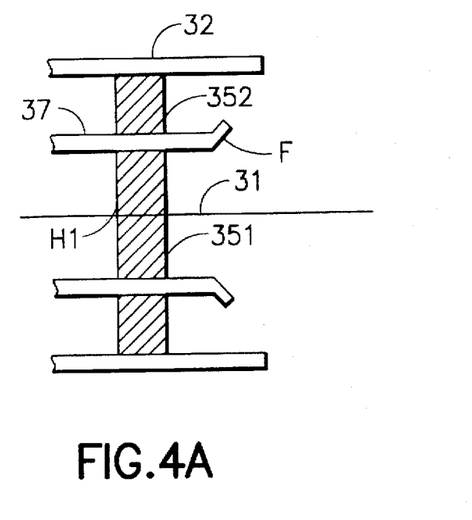
FIG. 4A is a diagram showing a form of the contact making and breaking device of this invention in which the end of the tubular conductor is bent into a flange shape.
Figure 4B:
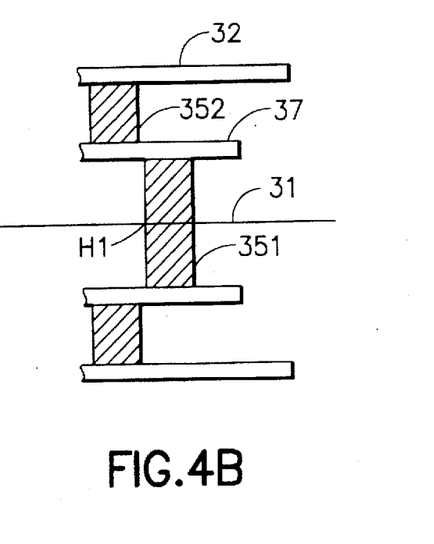
FIG. 4B is a diagram showing a form of the contact making and breaking device of this invention in which the ring-shaped insulating part is displaced toward the center of the reed relays.

FIGS. 4A and 4B are enlarged diagrams of the end of tubular conductor 37 of the reed relay. In reed relay 3 of FIG. 4A, the projecting part of the open end of tubular conductor 37 is bent outward, forming a flanged shape designated by F. In FIG. 4B, only ring-shaped insulating part 352 is placed towards the center of the reed relay 3.

In FIG. 4A, flanged part F, and in FIG. 4B, the position of ring-shaped insulating part 352, act in such a way that no insulating material is present in the capacitance space between wire 31 and conductive casing 32. Therefore, even if the projecting length of the end of tubular conductor 37 is short (or it does not project at all), the same effect can be obtained as when the projecting length is made long.

Figure 4C:
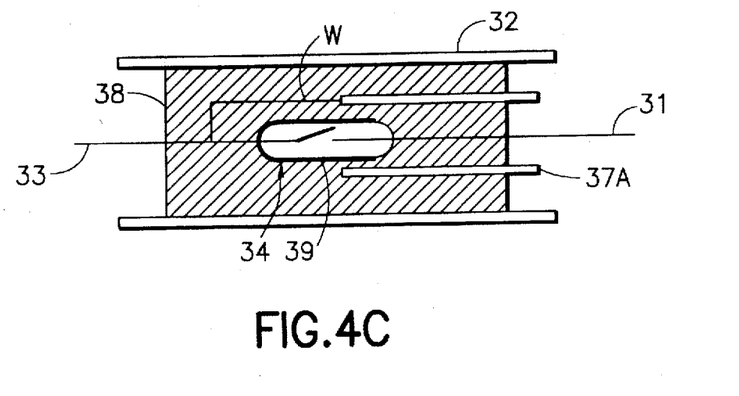
FIG. 4C is a diagram showing a form of the contact making and breaking device of this invention in which the insulating part is formed by filling.

FIG. 4C shows a reed relay which is formed by causing insulating material to fill the space inside the conductive casing. In FIG. 4C, insulating material 38 fills this space instead of insulating parts 351, 352, and 36 in the reed relay shown in FIG. 1A. Tubular conductor 37A, which is configured longer than tubular conductor of FIG. 1 (A), is supported inside conductive casing 32 by insulating material 38. In FIG. 4C, a conductive film 39 is formed on the outer surface of the reed switch, and does not touch signal wire 31 but is shorted to signal wire 33. Conductive film 39 also acts in such a way that there is no effects of insulating parts in the capacitance space between the wire inside the glass tube of the reed switch and conductive casing 32.

The various reed relays described above can be applied to multi-path relays or multi-path break relays, wherein the same structures are connected in parallel. Moreover, they can also be applied to mixed make/break relays, transfer relays, etc.

Figure 5:
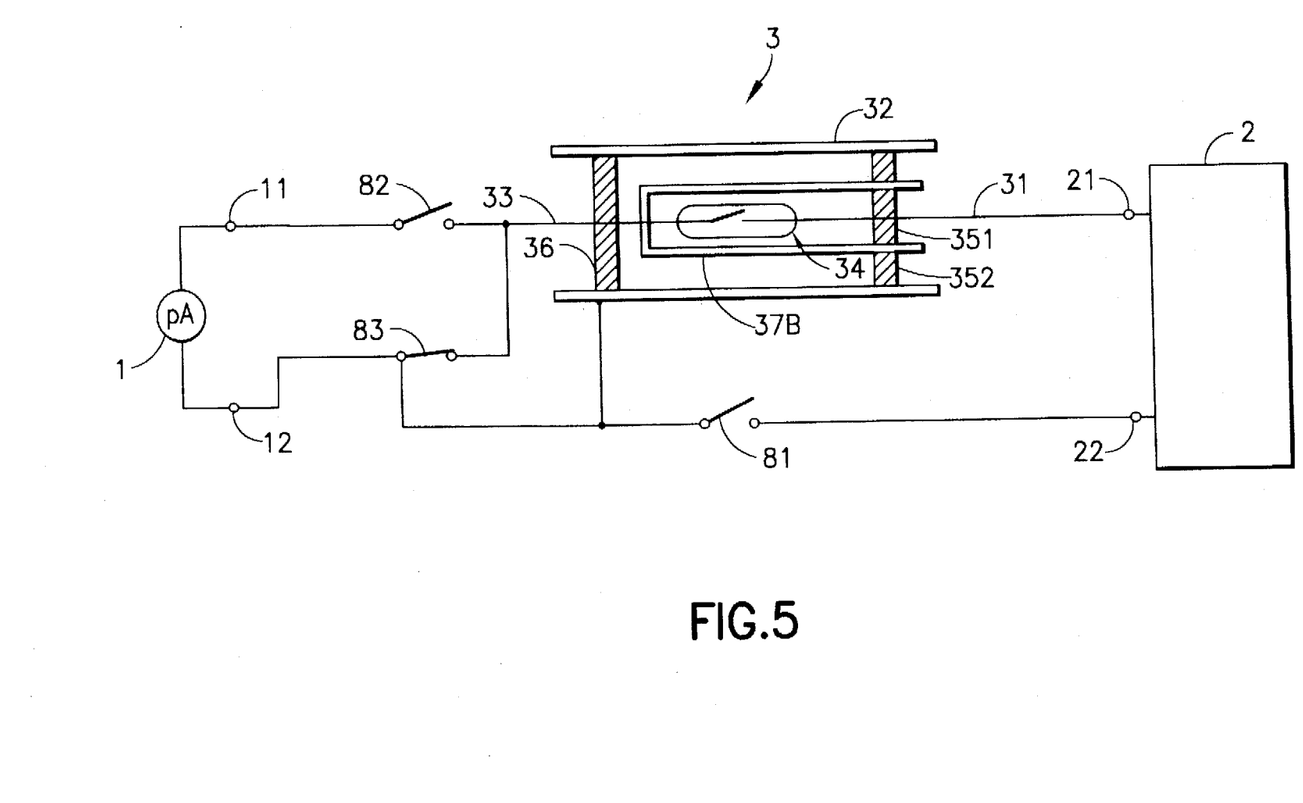
FIG. 5 is a diagram showing an example of the low current measurement system of this invention.

FIG. 5 shows low current measurement system of this invention, using the aforementioned reed relay. Here, for convenience, the explanation will use the reed relay of FIG. 1B, but one can also use the reed relays shown by FIGS. 1A, 1C and FIGS. 4A–C. This low current measurement system has the same structure as the low current measurement system already explained in FIG. 6, except that the reed relay is different, and the system that contains a current source 2 has an active guard.

In FIG. 5, the operations of reed relay 3 and switches 81–83 when a current is being measured and when it is not being measured are also the same as those in the low current measuring system of FIG. 6. That is, when a current is not being measured, the contact points of the reed switch 34 and the switches 81 and 82 are opened, and that of the switch 83 is closed. When a current is being measured, the contact points of the reed switch 34 and the switches 81 and 82 are closed, and that of the switch 83 is opened.

In the low current measurement system of FIG. 5, a tubular conductor 37B is placed in the insulating part between signal wire 31 and conductive casing 32. Moreover, since the open end of the tubular conductor 37B projects beyond insulating parts 351 and 352, as described above, there is almost no effects of insulating parts in the capacitance space between conductive casing 32 and signal wire 31. Therefore, even if there is a voltage of a certain value at force terminal 21 immediately before the current measurement is started, the current due to the charge between the conductive casing 32 and signal wire 31 flows instantly into picoammeter 1 when the contact point of the reed switch 34 is closed. Moreover, the current due to the charge between tubular conductor 37B and signal wire 31 flows through the contact point of the reed switch 34.

This current does not become zero instantaneously, due to the dielectric absorption of the circular insulting material 351 between tubular conductor 37B and signal wire 31, but since this current does not flow into picoammeter 1, it does not affect the current measurement.

The low current measurement system of this invention can be employed in various systems that do not have active guards (e.g., devices for measuring static capacities, current source devices, pulse generators, etc.), as well as in systems that contain current sources and that have active guards (e.g., systems containing switch matrices).

The following effects can be obtained by means of the invention described above.

(1) Since the insulating material contained in the capacitance space between one signal wire and the conductive casing of the reed switch is reduced, a contact making and breaking device can be provided in which the effect of dielectric absorption is reduced.

(2) By devising a method of connecting the signal wire and the guard before and after the measurement, using a contact making and breaking device with reduced dielectric absorption, a low current measurement system is provided which has an extremely short measurement waiting time when low current is measured.

While the invention is described in terms of a preferred embodiment, variations may be made without departing from the spirit and scope of the invention as claimed below.

We claim:

1. A contact making and breaking device, comprising:
   a reed switch including two terminals, a first signal wire connected to a first of said terminals and a second signal wire connected to a second of said terminals;
   an external conductive casing;
   insulating means positioned between said first signal wire and the external conductive casing;
   a tubular conductor positioned in the insulating means and between said first signal wire and the external conductive casing for decoupling said first signal wire from said external conductive casing; and
   means for electrically connecting the tubular conductor to the second signal wire.

2. A contact making and breaking device in accordance with claim 1, wherein the tubular conductor projects from the insulating means.

3. A contact making and breaking device in accordance with claim 1, wherein the reed switch is entirely contained within the tubular conductor.

4. A contact making and breaking device in accordance with claim 1, wherein the electrically connecting means comprises a wire.

5. A contact making and breaking device in accordance with claim 1, wherein the electrically connecting means comprises a conductive closing means closing an end of the tubular conductor.

6. A contact making and breaking device in accordance with claim 2, wherein the open end of the projected tubular conductor is bent outward.

7. A contact making and breaking device, comprising:

a reed switch including two terminals, a first signal wire connected to one of said terminals and a second signal wire connected to a second of said terminals;

an external conductive casing;

an insulating material filling the space inside the conductive casing containing the reed switch;

a tubular conductor positioned in the insulating material for decoupling said first signal wire from the external conductive casing, and a conductive film formed on the outer surface of the reed switch, connecting only to said first second signal wire; and means for electrically connecting the tubular conductor to the second signal wire.

8. A contact making and breaking device in accordance with claim 7, wherein the tubular conductor projects from the insulating means between said first signal wire and the external conductive casing.

* * * * *